United States Patent
Ogino et al.

(10) Patent No.: US 8,022,376 B2
(45) Date of Patent: Sep. 20, 2011

(54) METHOD FOR MANUFACTURING SEMICONDUCTOR DEVICE OR PHOTOMASK

(75) Inventors: Kozo Ogino, Kawasaki (JP); Takashi Maruyama, Kawasaki (JP)

(73) Assignee: Fujitsu Semiconductor Ltd., Yokohama (JP)

( * ) Notice: Subject to any disclaimer, the term of this patent is extended or adjusted under 35 U.S.C. 154(b) by 179 days.

(21) Appl. No.: 12/364,077

(22) Filed: Feb. 2, 2009

(65) Prior Publication Data
US 2009/0206282 A1    Aug. 20, 2009

(30) Foreign Application Priority Data
Feb. 18, 2008    (JP) ................. 2008-035680

(51) Int. Cl.
 *H01J 37/00* (2006.01)
 *G06F 17/50* (2006.01)
(52) U.S. Cl. ............... 250/492.22; 716/53
(58) Field of Classification Search ......... 250/492.22
 See application file for complete search history.

(56) References Cited

U.S. PATENT DOCUMENTS

| | | | | |
|---|---|---|---|---|
| 4,132,898 A | * | 1/1979 | Buelow et al. | 250/492.2 |
| 4,816,692 A | * | 3/1989 | Rudert, Jr. | 250/492.2 |
| 5,189,306 A | * | 2/1993 | Frei | 250/492.2 |
| 2006/0195815 A1 | * | 8/2006 | Ogino et al. | 716/21 |

FOREIGN PATENT DOCUMENTS

| | | |
|---|---|---|
| JP | 06-13298 | 1/1994 |
| JP | 2002-170768 | 6/2002 |

OTHER PUBLICATIONS

German Office Action for corresponding German Application 10 2009 009 319.1-54;dated Sep. 8, 2010.

\* cited by examiner

*Primary Examiner* — Jack Berman
*Assistant Examiner* — David E Smith
(74) *Attorney, Agent, or Firm* — Staas & Halsey LLP

(57) ABSTRACT

A method for manufacturing a semiconductor device or a photomask by exposing a pattern while scanning a plurality of deflection regions determined depending on a deflection width of an exposure device on an exposure target with electron beams, enables a computer to execute a step of extracting a first pattern that exists near the boundary of the deflection region and in a first deflection region, a step of searching a second pattern that is adjacent to the first pattern and in a second deflection region different from the first deflection region, and a step of performing data processing of exposure data in accordance with a width of the first pattern so as to minimize the change in distance between the extracted first pattern and the searched second pattern due to positional deviation of the deflection region.

17 Claims, 16 Drawing Sheets

FIG. 9A
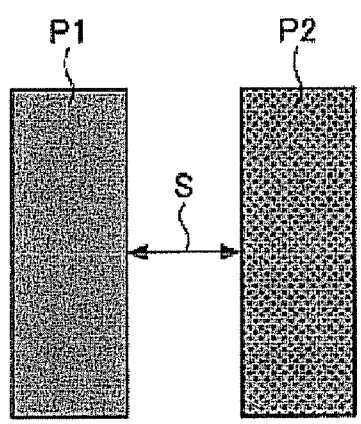
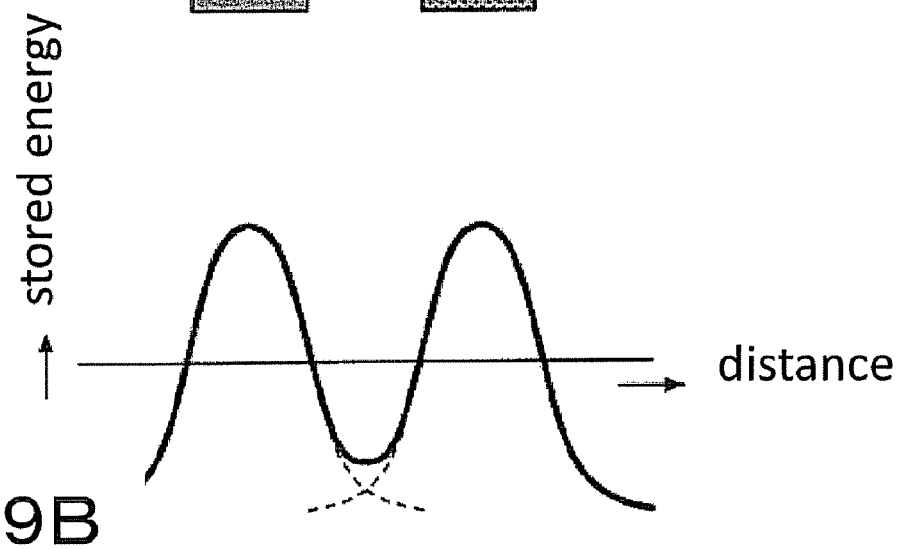
FIG. 9B

METHOD FOR MANUFACTURING SEMICONDUCTOR DEVICE OR PHOTOMASK

CROSS REFERENCE TO RELATED APPLICATION

This application is based upon and claims the benefit of priority from the prior Japanese Patent Application NO. 2008-35680 filed on Feb. 18, 2008, the entire contents of which are incorporated herein by reference.

BACKGROUND OF THE INVENTION

1. Field of the Invention

The present invention relates to a method for manufacturing a semiconductor device and a photomask, and in particular, to a method for manufacturing a semiconductor device and a photomask with an exposure technology of electron beams.

2. Description of the Related Art

In an electron-beam exposure device, a region for exposure is divided into a plurality of fields determined depending on a deflection width of a main deflector, the fields are divided into a plurality of sub-fields determined depending on a deflection width of a sub-deflector, electron beams for variable shaping are emitted every divided sub-field, and a pattern is exposed. Therefore, the connection accuracy of a connecting portion of the pattern over the sub-fields boundary, particularly, the connection accuracy of the pattern between the sub-fields belonging to adjacent fields is strict, and there is a problem of deterioration in resolution of the pattern at the sub-field boundary.

As a conventional method for improving the connection accuracy of the pattern over the sub-field boundary, there is proposed a method for generating an additional pattern at the connection portion as disclosed in Japanese Laid-open Patent Publication No. 6-13298 and a method for multiple-exposure by changing the boundary position of the field as disclosed in Japanese Laid-open Patent Publication No. 2002-170768.

Recent fine processing and high density of a semiconductor device (or a semiconductor element) causes problems of not only deterioration in connection accuracy of the pattern at the sub-field boundary due to an error of positional precision of the sub-field but also deterioration in resolution of a narrow space in the sub-field boundary. As the space between large patterns is narrower, the fog of the amount of exposure of electron beams due to back scattering from a substrate is large and the short-circuit can easily occur due to the positional deviation between the sub-fields.

However, the method for generating the additional pattern disclosed in Japanese Laid-open Patent Application Publication No. 6-13298 is not applied to space. Further, with the method for multiple-exposure disclosed in Japanese Laid-open Patent Publication No. 2002-170768, the positional deviation between the patterns affects the similar influence of blur of the electron beams, and the exposure margin of narrow space is reduced. Therefore, this method may not be used as much as possible. As mentioned above, the conventional methods have a problem that the deterioration of resolution of the narrow space cannot be certainly prevented.

SUMMARY OF THE INVENTION

According to one aspect of the present invention, there is provided a method for manufacturing a semiconductor device or a photomask by exposing a pattern while scanning a plurality of deflection regions determined depending on a deflection width of an exposure device on an exposure target with electron beams, enables a computer to execute: a step of extracting a first pattern that exists near the boundary of the deflection region and in a first deflection region; a step of searching a second pattern that is adjacent to the first pattern and in a second deflection region different from the first deflection region; and a step of performing data processing of exposure data in accordance with a width of the first pattern so as to minimize the change in distance between the extracted first pattern and the searched second pattern due to positional deviation of the deflection region.

The object and advents of the embodiments will be realized and attained by means of the elements and combinations particularly pointed out in the claims.

It is to be understood that both the foregoing general description and the following detailed description and are exemplary and explanatory and are not restrictive of the embodiments, as claimed.

BRIEF DESCRIPTION OF THE DRAWINGS

FIGS. 9A and 9B are explanatory diagrams of a relationship between patterns and a stored energy distribution as a result of irradiation with electron beam;

DESCRIPTION OF THE PREFERRED EMBODIMENTS

Upon manufacturing a semiconductor device or a photomask, a region for exposure is divided into a plurality of deflection regions determined depending on a deflection width of an exposure device, and the change in space between adjacent patterns at the deflection region is minimized, thereby improving the resolution of a narrow space at the boundary of the deflection region. That is, the change in space due to the positional deviation between the deflection regions is minimized, thereby improving the resolution of narrow space of the deflection region.

Processing of exposure data is closed in adjacent patterns at the boundary of the deflection region. Therefore, the resolution of the space other than the narrow space is not influenced by the positional deviation of the deflection region. Further, data processing of the exposure data is performed only to adjacent patterns at the boundary of the deflection region. Therefore, the increase in the amount of the exposure data due to the data processing of the exposure data is extremely small. Thus, drawing resolution of the electron-beam exposure device can be improved.

Hereinbelow, a description will be given of a method for manufacturing a semiconductor device and a photomask according to embodiments of the present invention and subsequent drawings.

Embodiment

Figure 1:
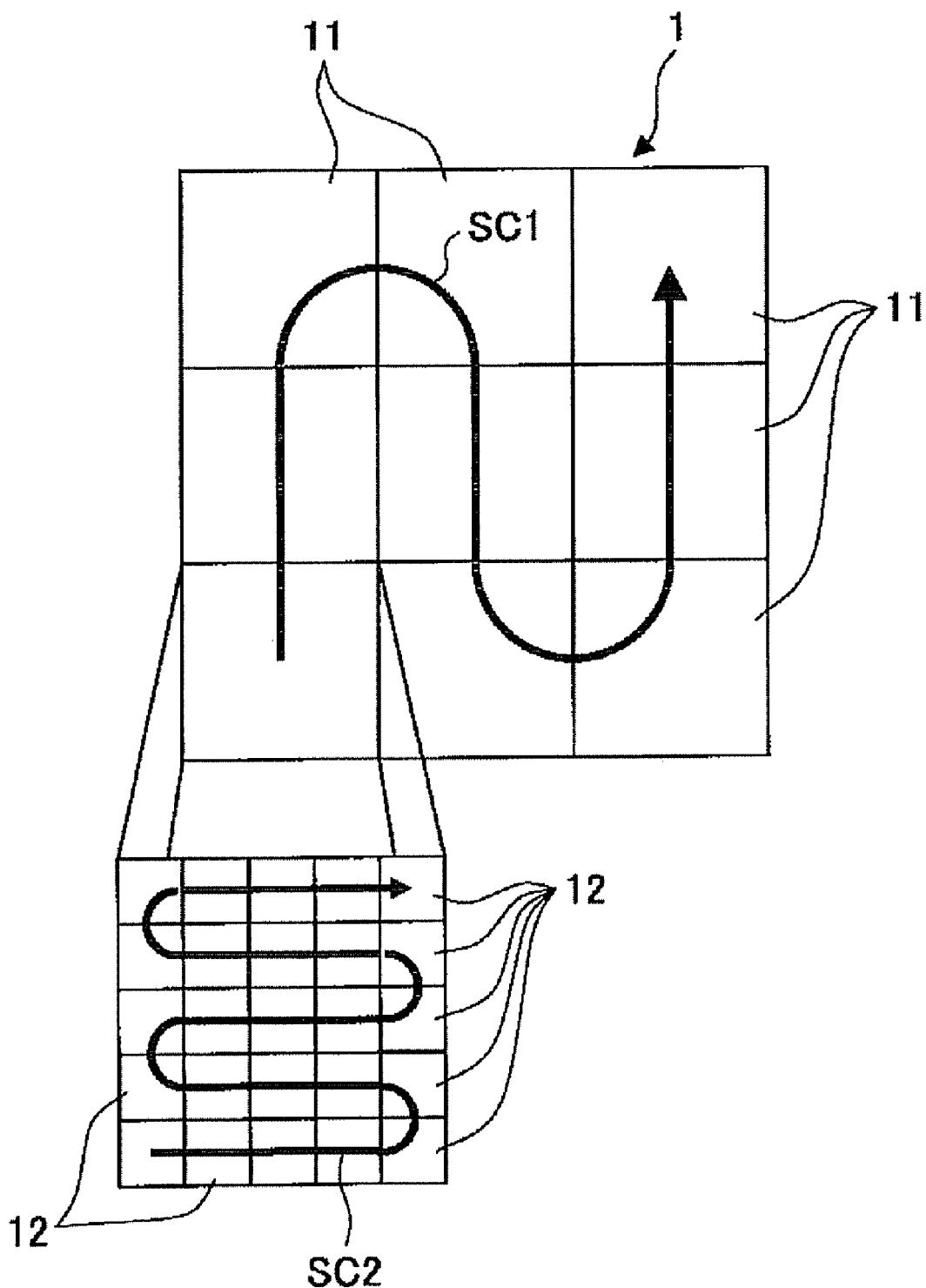
FIG. 1 is an explanatory diagram of a relationship between a field and a sub-field.

FIG. 1 is an explanatory diagram of a relationship between the field and the sub-field. Referring to FIG. 1, reference numeral 11 denotes a field of a semiconductor wafer 1, and reference numeral 12 denotes a sub-field forming one field 11. Further, a thick arrow SC1 conceptually denotes the scanning direction of electron beams to a set of the fields 11, and a thick arrow SC2 conceptually denotes the scanning direction of electron beams to a set of the sub-fields 12 (i.e., in one field 11). Incidentally, a set of nine fields 11 is shown in FIG. 1 for the purpose of a brief description.

Figure 2:
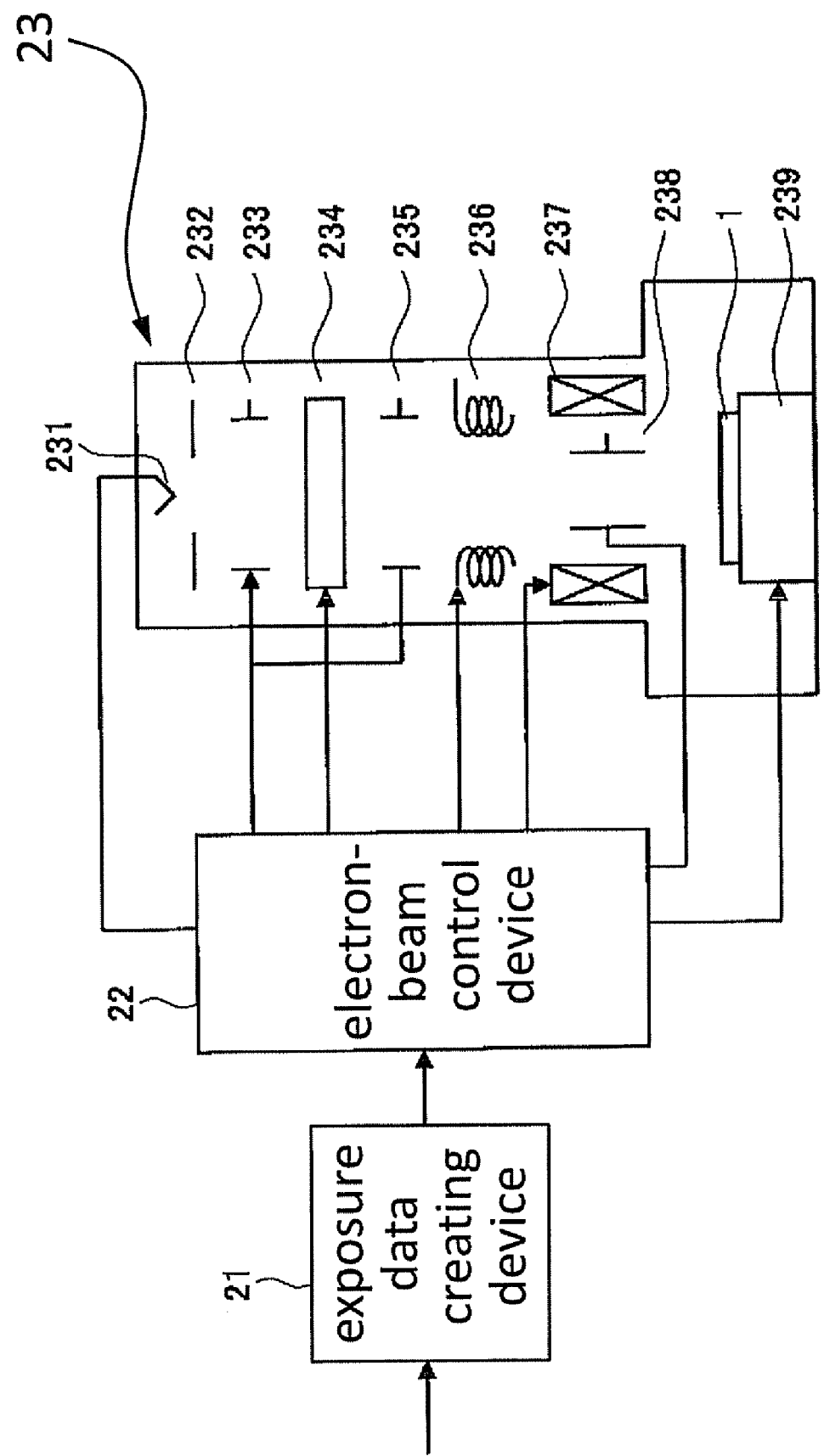
FIG. 2 is a diagram showing the schematic structure of an electron-beam exposure device according to the embodiment invention.

FIG. 2 is a diagram showing the schematic structure of an electron-beam exposure device 20 according to the present embodiment. Referring to FIG. 2, the electron-beam exposure device 20 comprises: an exposure data creating device 21; an electron-beam control device 22; and an exposure device 23. The exposure device 23 comprises: an electron gun 231; a rectangular-shaping mask 232, a mask deflector 233; a block mask 234; a mask deflector 235; a focusing range adjusting unit 236; a main deflector 237; a sub-deflector 238; and a stage 239. The exposure data creating device 21 creates the exposure data of the semiconductor device or the photomask for exposure on the basis of design data inputted from a storage unit (not shown), an input device (not shown), and a host device (not shown). The electron-beam control device 22 controls units in the exposure device 23 on the basis of the exposure data. Thus, electron beams emitted from the electron gun 231 irradiate a wafer 1 placed on the stage 239 via the rectangular-shaping mask 232 to the sub-deflector 238, and the pattern is exposed to a resist layer formed onto the wafer 1 in accordance with the exposure data.

The exposure data creating device 21 can be structure by a general computer comprising a processor such as a CPU or MPU, a storage unit for storing a program or data, and an input unit such as a key board. The storage unit may be a computer-readable storage medium for storing the program or may be structured by installing the program from the computer-readable storage medium. The program includes a program that enables the computer to a routine of at least exposure data creating processing. According to the present invention, for the purpose of a brief description, the storage unit stores a program for executing the computer to execute a routine of manufacturing steps of the semiconductor device and the photomask.

The electron-beam exposure device 20 exposes the pattern of the photomask onto the wafer 1. Thereafter, with well-known mask processing, various photomasks such as the block mask 234 are manufactured. Further, the electron-beam exposure device 20 exposes the pattern of the semiconductor device (or semiconductor element) onto the wafer 1. Thereafter, with well-known wafer processing, the semiconductor device is manufactured.

With the electron-beam exposure device 20 for exposing the pattern by scanning a plurality of deflection regions determined depending on the deflection width of the field or the sub-field in the exposure device 23, when the patterns in different deflection regions are adjacent to each other at the boundary of the deflection region, the exposure data needs to be processed so as to minimize the change in distance between the patterns, caused by the positional deviation of the deflection region. In this case, the processing of the exposure data means that the exposure data is subjected to processing for changing the shape of the pattern, changing the amount of exposure applied to the pattern, and adding a new pattern.

As the pattern is larger, the fog of the amount of exposure due to back scattering of the electron beams from the wafer (or semiconductor substrate) 1 is larger. The margin to the change in the amount of exposure is reduced, and the short-circuit is easily caused by the positional deviation of the deflection region in narrow space between the patterns. Therefore, as the pattern is larger, the space is required without fails. Then, according to the embodiment, the exposure data creating processing as shown in FIG. 3 is performed.

Figure 3:
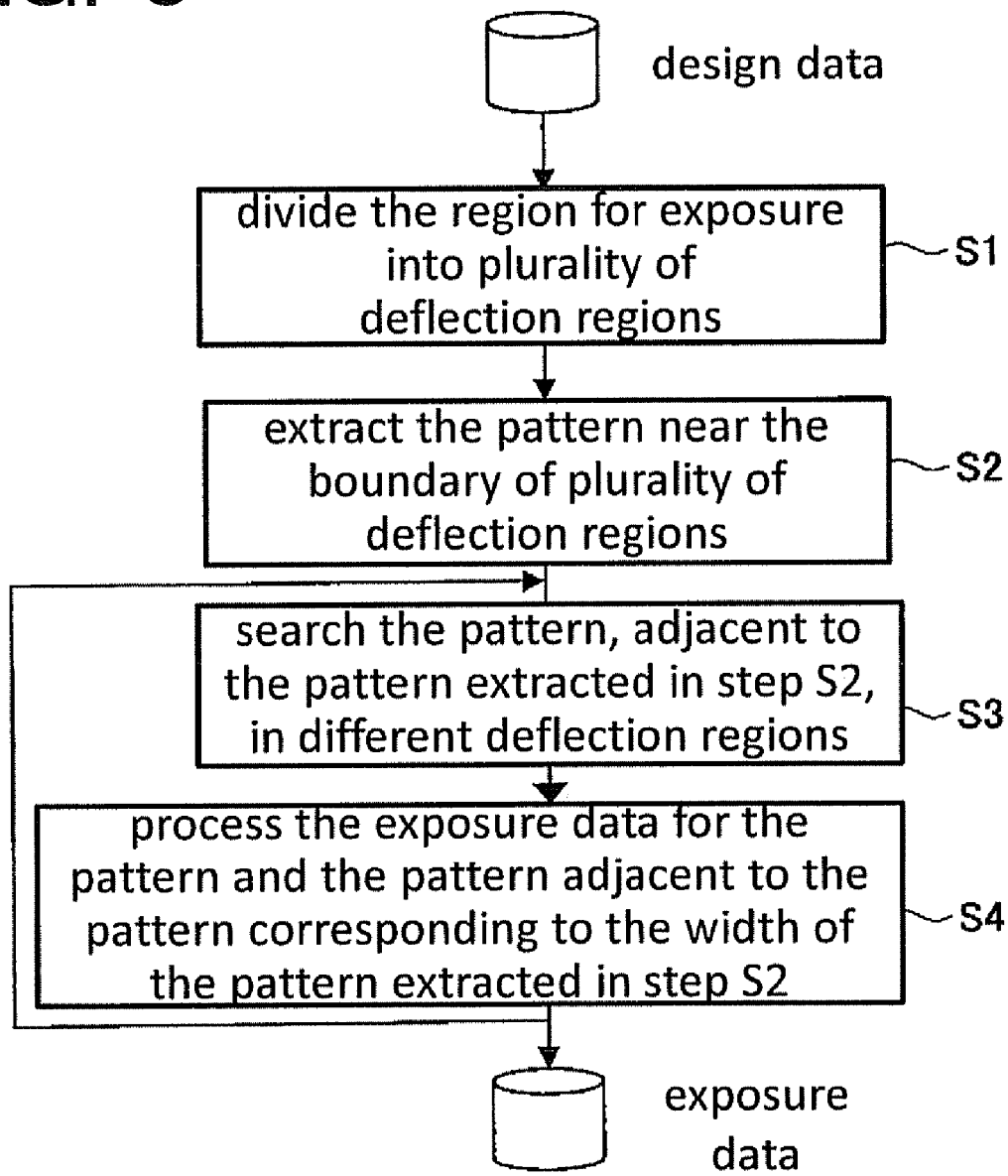
FIG. 3 is a flowchart for explaining exposure-data creating processing executed by an exposure data creating device according to an embodiment of the present invention.

FIG. 3 is a flowchart for explaining the exposure data creating processing executed by the exposure data creating device 21, i.e., a processor in the computer according to the embodiment. Referring to FIG. 3, in step S1, the region for exposure on the wafer 1 is divided into a plurality of deflection regions. Specifically, the region for exposure on the wafer 1 is divided into the fields 11 as shown in FIG. 1, and the fields 11 are further divided into the sub-fields 12. In step S2, the pattern near the boundary of a plurality of deflection regions obtained by dividing the region for exposure in step S1 (boundary of the sub-field 12) is extracted. In step S3, the pattern, adjacent to the pattern extracted in step S2, in different deflection regions (sub-field 12) is searched within a search area. In step S4, the exposure data is processed corresponding to the width of the pattern extracted in step S2 so as to minimize the change in distance between the pattern extracted in step S2 with the positional deviation of the deflection region (sub-field 12) and the pattern searched in step S3. In steps S3 and S4, the processing is repeated by the number of times corresponding to the number of the extracted pattern. According to the present invention, in step S1, a plurality of deflection regions obtained by dividing the region for exposure are the sub-fields 12. Alternatively, a plurality of deflection regions may be the fields 11. Since the movement of the stage 239 adjusts the scanning position on the wafer 1, the positional deviation is easily increased. Therefore, an advantage for improving the resolution of the space between the adjacent patterns at the boundary of the deflection region is remarkable when the deflection region is the field 11.

Figure 4:
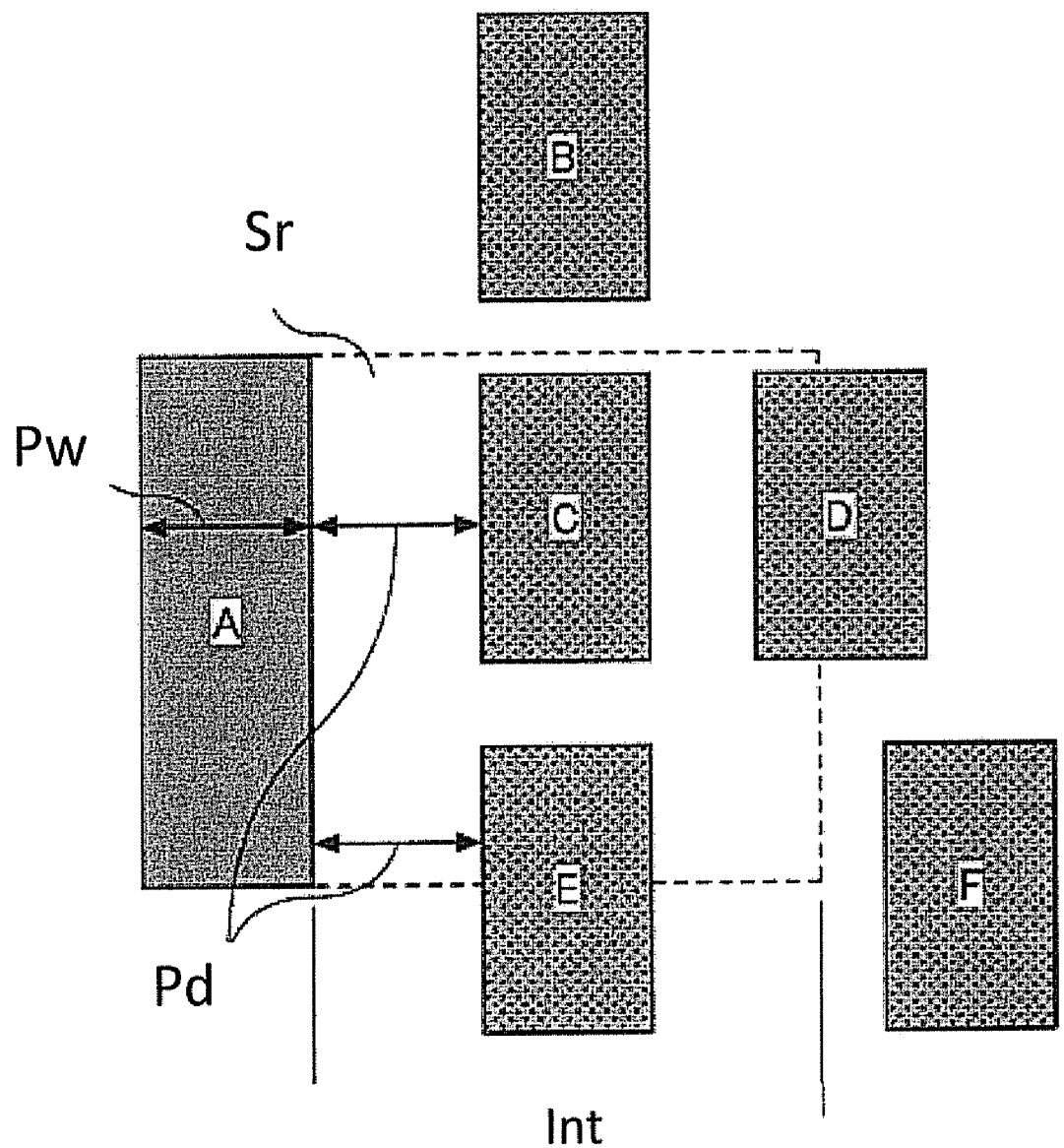
FIG. 4 is a plan view showing an example of adjacent patterns at the boundary of a deflection region.

FIG. 4 is a plan view showing an example of adjacent patterns at the boundary of the deflection region. Referring to FIG. 4, reference numeral A denotes a pattern at the boundary of one deflection region, and reference numerals B to F denote patterns near the right side of the pattern A and in the deflection region of the pattern A. Further, reference numeral Pw denotes a pattern width of the pattern A, reference numeral Pd denotes the distance between the pattern A and patterns C and E, and reference numeral Sr denotes the search region in step S3. The patterns C and E are adjacent patterns of the pattern A. The pattern B is not in the vertical direction from the side of the pattern A and, therefore, is not a pattern adjacent to the pattern A. Although a part of the pattern D is included within a range of an interval Int externally-determined in the vertical direction of the side of the pattern A, it is shut-off from the pattern C. Therefore, the pattern D is not adjacent to the pattern A. Although the pattern F is in the vertical direction of the side of the pattern A, a part of the pattern F is not included within the externally-determined interval Int. Therefore, the pattern F is not adjacent to the pattern A.

Figure 5:
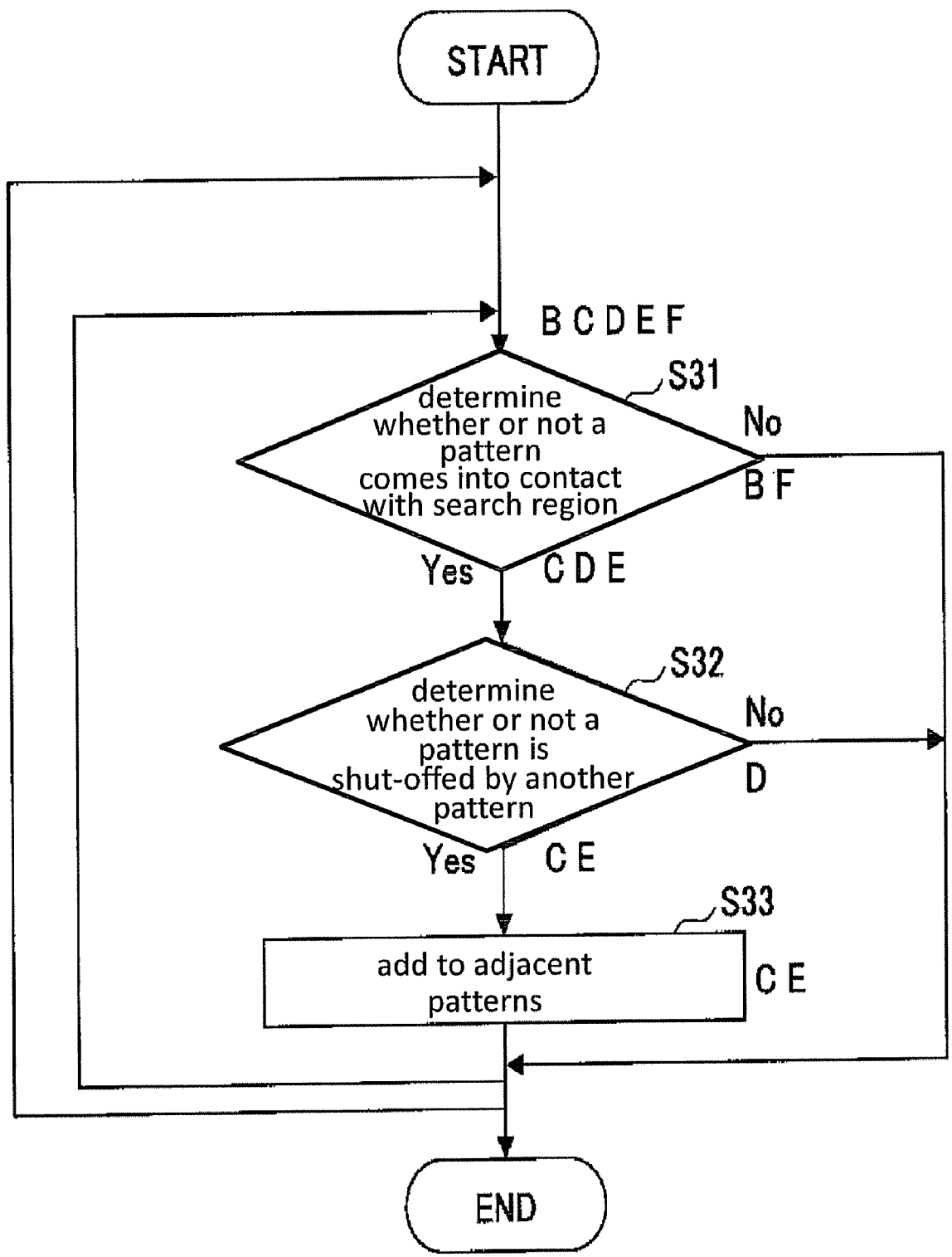
FIG. 5 is a flowchart for specifically explaining processing in step S3 shown in FIG. 3.

FIG. 5 is a flowchart for specifically explaining the processing in step S3 in FIG. 3. Referring to FIG. 5, in step S31, it is determined whether or not a pattern as a candidate comes into contact with the search region Sr. When the pattern as the candidate is the pattern B or F, the determining result in step S31 is NO and the processing then ends. On the other hand, the pattern as the candidate is the pattern C, D, or E, the determining result in step S31 is YES and the processing then advances to step S32. In step S32, it is determined whether or not the pattern as the candidate is shut-off by another pattern. When the pattern as the candidate is the pattern D, the determining result in step S32 is NO and the processing then ends. When the pattern as the candidate is the pattern C or E, the determining result in step S32 is YES and the processing then advances to step S33. In step S33, the pattern C and E as the candidate are added as adjacent patterns near the extracted pattern A and in different deflection regions (sub-fields 12), and the processing then ends. In steps S31 to S33, the processing is repeated to the side of the extracted pattern A by the number of times corresponding to the number of patterns in different deflection regions (sub-fields 12).

In step S4 in FIG. 3, if the patterns are apart from each other to some degree, the resolution of the space between the patterns is easily influenced from the positional deviation of the deflection region (sub-field 12). Therefore, in order to suppress the increase in data creating time and the increase in the amount of data due to the data processing, the data is processed only when the distance between the patterns is within a prescribed value.

On the other hand, even if the distance between adjacent patterns at the boundary of the deflection region (sub-field 12) is within a prescribed range, when the pattern as the candidate is shut-off by another pattern, the data on the adjacent patterns does not need to be processed. Because, if the pattern is large to easily generate the short-circuit as will be described later, the pattern is divided and the data processing is closed between the adjacent patterns, the positional deviation of the deflection region (sub-field 12) does not influence to the pattern out of the adjacent patterns.

Then, in step S4, data processing methods (ma), (mb), and (mc) are switched depending on the width of the pattern and are then used as follows.

Figure 6:
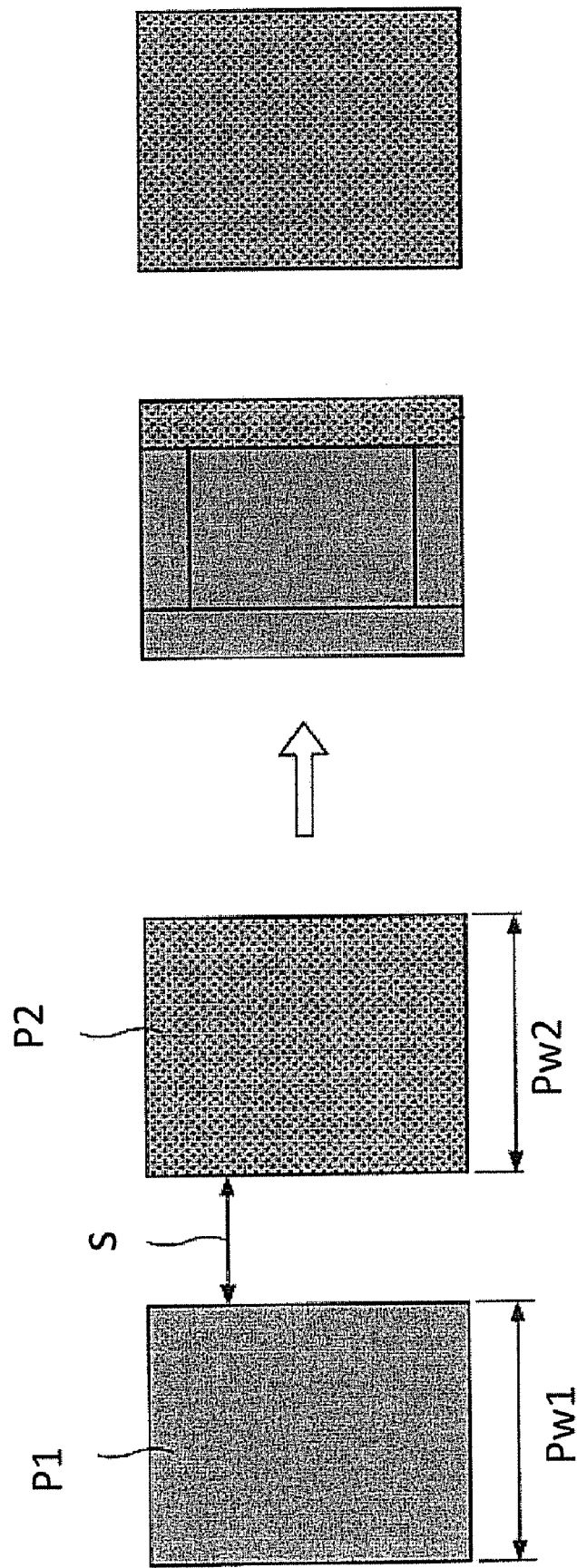
FIG. 6 is an explanatory diagram of a data processing method (ma)
Figure 7:
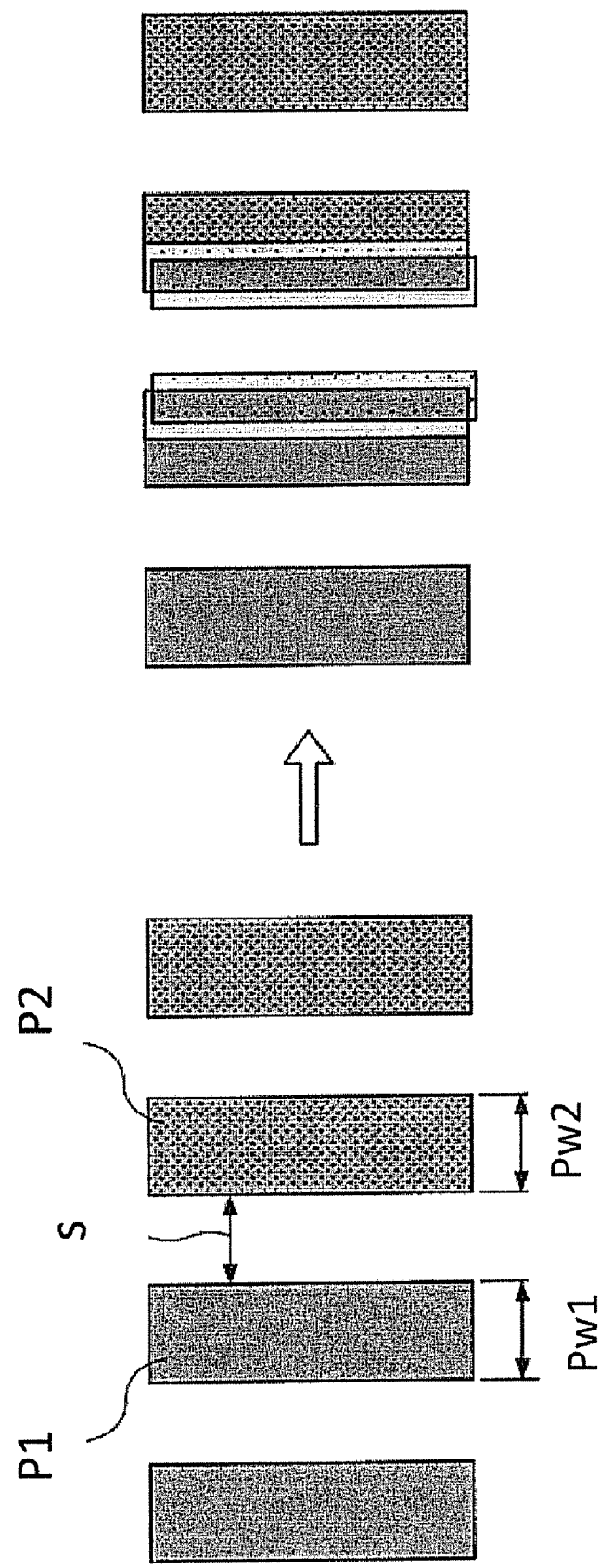
FIG. 7 is an explanatory diagram of a data processing method (mb)
Figure 8:
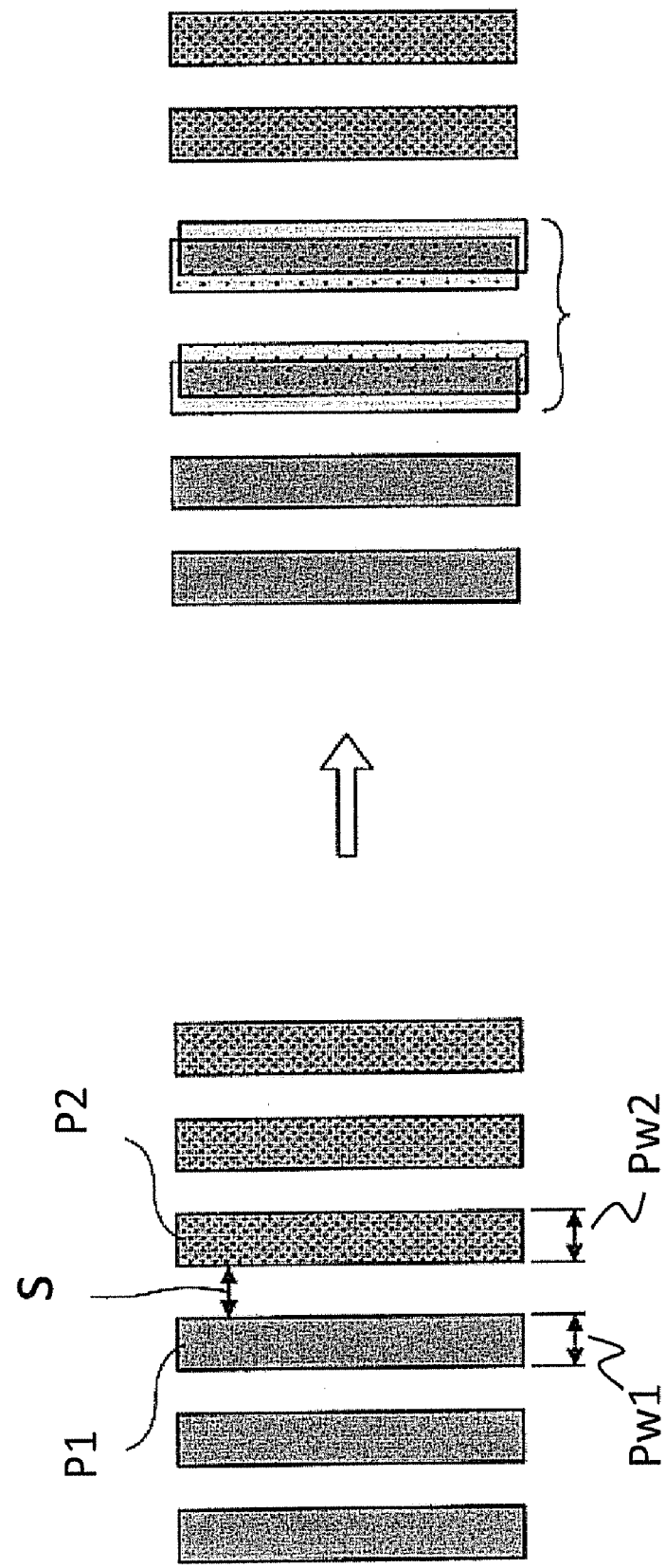
FIG. 8 is an explanatory diagram of a data processing method (mc)

FIG. 6 is an explanatory diagram of the data processing method (ma). Referring to FIG. 6 and FIG. 7 and FIG. 8 which will be described later, the pattern before the processing is shown on the left side, and the pattern after the processing is shown on the right side. In the case of a thick pattern P1 having a pattern width Pw1 not-less-than than an externally-determined width Ws1 in a deflection region F1, the pattern P1 is divided into an edge portion and an inner portion and the registration is changed so that the drawing is performed from a deflection region F2 of a pattern P2 adjacently having an edge portion of the pattern P1 on the side of the pattern P2 having a pattern width Pw2 of adjacent patterns within a range of an externally-determined interval Int 1. As a result, since the boundary of the deflection region shifts to the inside of the thick pattern P1, the positional deviation of the deflection region F1 or F2 does not influence on space S and the short-circuit is not easily caused in the space S. Herein, when the range of the allowable amount of change to a line width is ±Tp % and the maximal amount of the positional deviation of the deflection region F2 is ΔXmax, the externally-determined width Ws1 is preferably (2×ΔXmax)/(Tp/100) or more. Because the boundary between the deflection regions F1 and F2 shifts to the inside of the pattern P1 and it is considered that the positional deviation of the deflection regions F1 or F2 causes the line width to change corresponding thereto. Further, the width corresponding to the edge portion is preferably "two times of the maximal amount of the positional deviation of the deflection region F2"+"the amount of blur of the electron beams" or more and is also preferably "the half of the pattern width Pw1" or less. The condition of the minimal value is set because the amount of exposure to be originally kept within the inner portion of the pattern P1 is not widened to the space S when the deflection region F2 is position-deviated in the direction in which the edge portion of the pattern P1 is close to the inner portion.

FIG. 7 is an explanatory diagram of the data processing method (mb). In the case of a slightly thick pattern P1 having the pattern width Pw1 not-less-than the externally-determined width Ws2 of the pattern and less-than the width Ws1 in the deflection region F1, the pattern P1 is divided into the edge portion and the inner portion. The amount of exposure of the edge portion on the existing side of the pattern P2 of the pattern width Pw2 of adjacent patterns within the range of the externally-determined interval Int2 and the amount of exposure of the edge portion in the partner pattern P2 are half, respectively. Then, the half amount of exposure is double-registered to the deflection regions F1 and F2. As mentioned above, the pattern P1 is divided and the data only on the facing side of adjacent patterns P1 and P2 at the boundary of the deflection region is processed, thereby preventing the influence of the positional deviation of the deflection region F1 or F2 from being affected to the outside of a pair of the patterns P1 and P2. Further, the double exposure of the facing side of the patterns P1 and P2 properly reduces both the change in line width and the change in space S. With respect to the patterns P1 and P2 for the data processing, the resolution of the space S is not severely ensured, as compared with the processing method (ma) and, however, it is advantageous upon reducing the change in space S and the change in line width. Therefore, the range of the allowable amount of change to the line width is ±Tp % and the maximal amount of the positional deviation of the deflection region is ΔXmax, the externally-determined width Ws2 is preferably ΔXmax/(Tp/100) or more. Because it is considered that the double exposure of only one side of the patterns P1 and P2 moves the edge on the side of non-double-exposure due to the positional deviation of the deflection region F1 or F2 and the line width can be thereby changed.

FIG. 8 is an explanatory diagram of the data processing method (mc). In the case of a thin pattern P1 having the pattern width Pw1 less-than the externally-determined width Ws2 within the deflection region F1, the amounts of exposure of the pattern P2 having the pattern width Pw2 of adjacent patterns within an externally-determined interval Int3 and the pattern P1 are respectively half, and double registration is performed to the deflection regions F1 and F2 thereof. Since the thin patterns P1 and P2 relatively have a small fog of the amount of exposure of the space S, the line-width accuracy of the patterns P1 and P2 is more important than the resolution of the space S. The pattern P1 is not divided but is subjected to the double exposure, thereby reducing the change in line width due to the positional deviation of the deflection region F1 or F2.

Further, when different data processing methods are applied to the two adjacent patterns P1 and P2 at the boundary of the deflection region, the data processing method in the case of a large pattern width Pw1 is used. That is, the data processing methods are used in order of the data processing method (ma), the data processing method (mb), and the data processing method (mc). Because the thick pattern P1 prevents the occurrence of the short-circuit in the space S.

Upon scanning the deflection region with the exposure device 23, as shown in FIG. 1, such an operation is repeated that a constant number of the deflection regions are scanned in a predetermined direction and a constant number of the deflection regions are scanned by changing the scanning direction. Therefore, relatively positional deviation is easily large at the boundary of the deflection region perpendicular to the scanning direction. In particular, the field as the main deflection region has remarkable positional deviation because the movement of the stage 239 adjusts the scanning position on the wafer 1. Then, the data processing is subjected to only the pattern near the boundary of the deflection region perpendicular to the scanning direction of the deflection region with the exposure device 23 by setting the deflection region as one field. As a consequence, the resolution of narrow space can be improved and the creating time of the exposure data can be reduced. Further, the increase in the amount of exposure data can be suppressed.

Figure 10A:
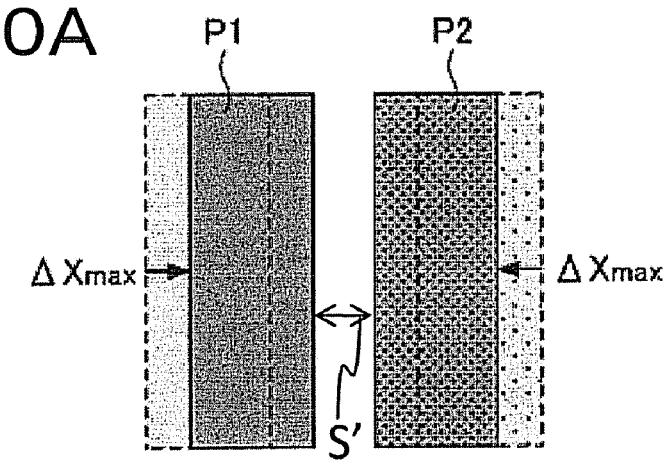
FIGS. 10A and 10B are explanatory diagrams of setting of an externally-determined interval Int.
Figure 10B:
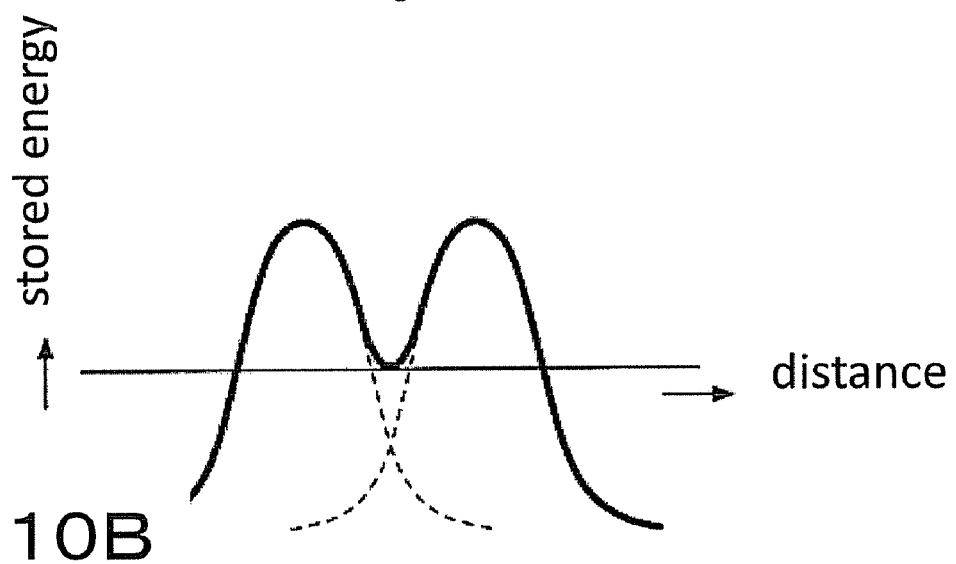

FIGS. 9A and 9B are explanatory diagrams of a relationship between the pattern and a stored energy distribution as a result of irradiation of electron beams. FIGS. 10A and 10B are explanatory diagrams of setting of the externally-determined interval Int. Referring to FIGS. 9A to 10B, FIGS. 9A and 10A show the patterns P1 and P2 apart from each other by the space S, and FIGS. 9B and 10B show stored energy distributions of energy stored to the resist layer on the wafer 1 with electron beams irradiated upon exposing the patterns in FIGS. 9A and 10A. Referring to FIGS. 9A to 10B, the ordinate in FIGS. 9B and 10B indicates the stored energy on the basis of an arbitrary unit, and the abscissa in FIGS. 9B and 10B indicates the distance on the wafer 1 on the basis of an arbitrary unit.

When the deflection regions F1 and F2 of the patterns P1 and P2 apart from each other by the space S shown in FIG. 9A are close to each other with the maximal amount $\Delta X max$ of the positional deviation, if a width of the space S' shown in FIG. 10A is less than $3\beta f$, i.e., $S'=S-2\Delta X max<3\beta f$, the widespread of the front scattering of electron beams starts to generate the fog of the amount of exposure from the adjacent patterns. Herein, reference numeral S denotes a width of the space S and reference numeral S' denotes a width of the space S', and reference numeral $\beta f$ denotes $1/e$ radius of the front scattering strength distribution (Gaussian distribution) of the electron beams incident on one point, corresponding to $\sqrt{2}$ times of the standard variation. Therefore, the externally-determined interval Int is preferably not-more-than $3\beta f+2\Delta X max$. More preferably, a width of the space S' with which the dimension change is over the allowable value by exposure experiment is obtained and the externally-determined interval Int is set to $S'+2\Delta X max$.

Figure 11:
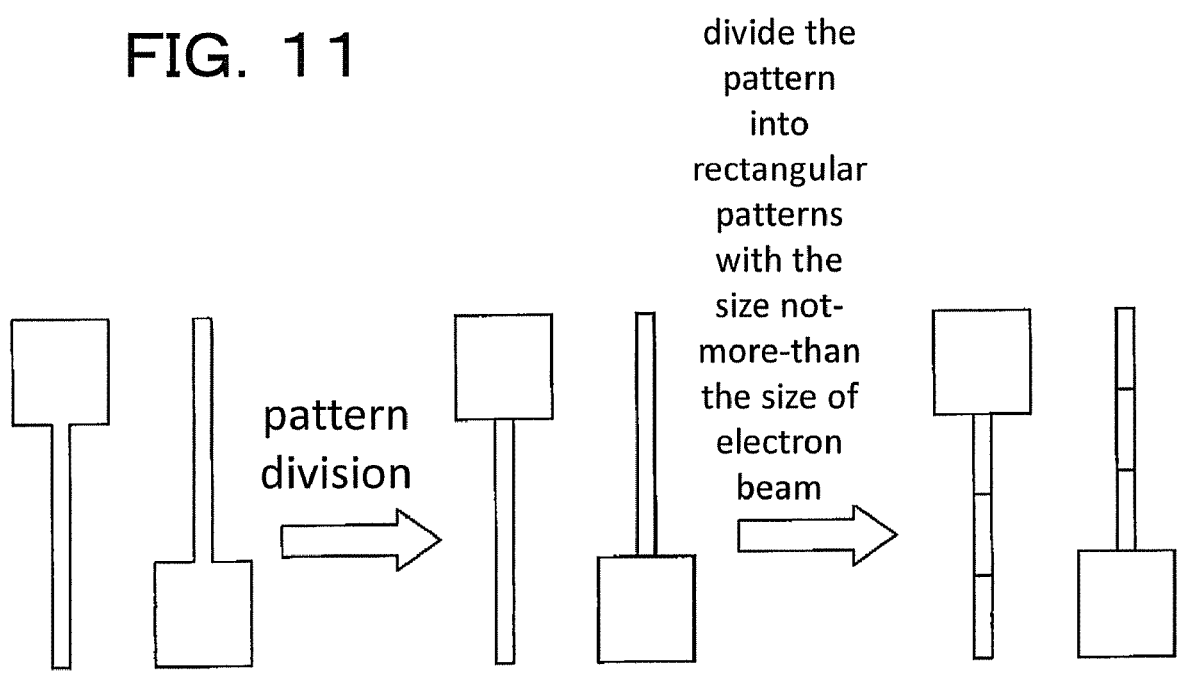
FIG. 11 is an explanatory diagram of an example of dividing a pattern into rectangular patterns.

FIG. 11 is an explanatory diagram of an example of dividing the pattern into rectangular patterns. Referring to FIG. 11, when the pattern for exposure has a shape except for a rectangular shape, the pattern is first divided into rectangular patterns. When the size of the pattern after the division is over the size of electron beams for irradiation onto the resist layer, the pattern is further divided into rectangular patterns with the size not-more-than the size of electron beams. The data processing is performed to the rectangular patterns divided with the size not-more-than the size of electron beams.

Figure 12:
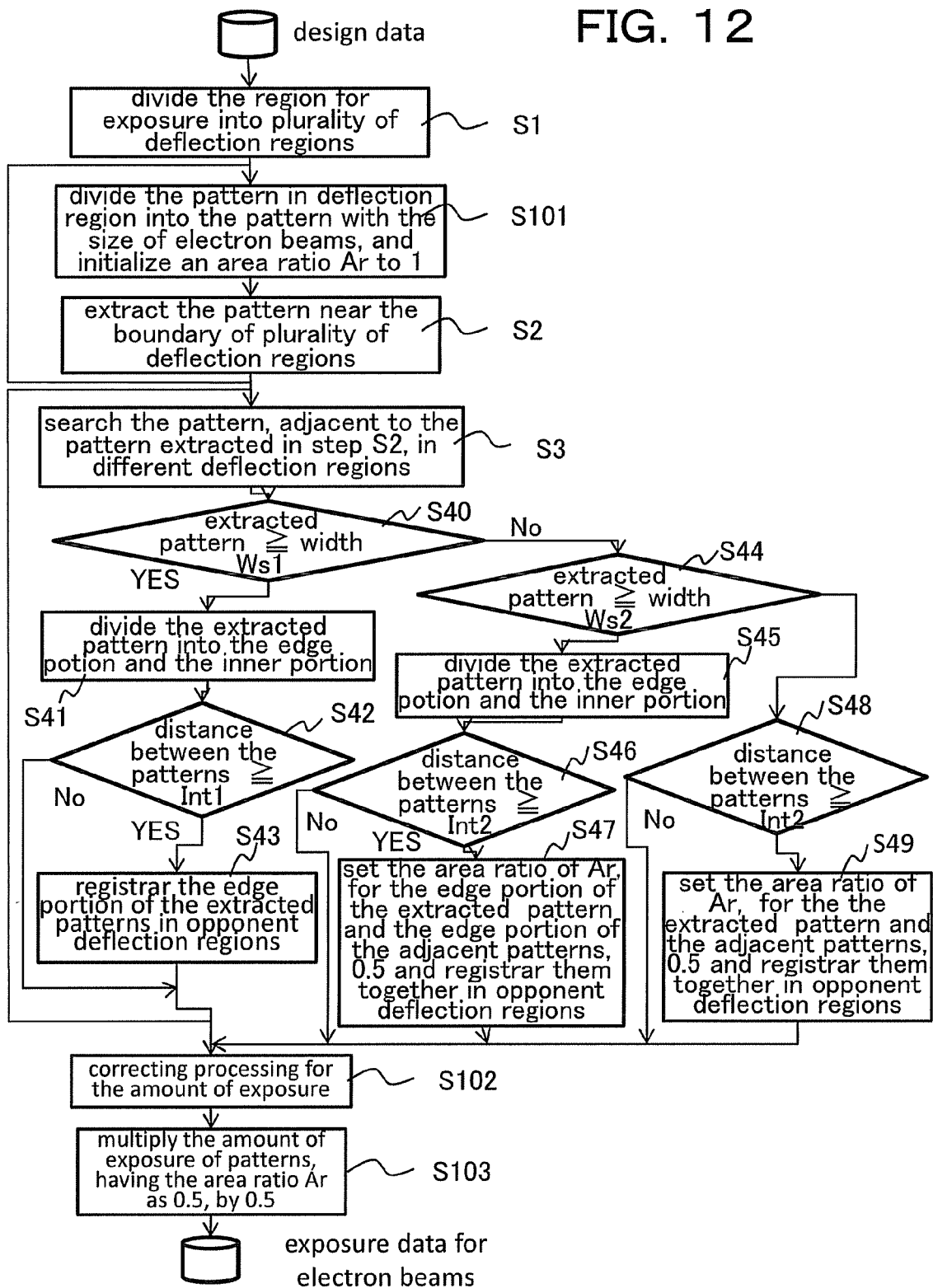
FIG. 12 is a flowchart for specifically explaining exposure data creating processing executed by an exposure data creating device according to the embodiment.

FIG. 12 is a flowchart for specifically explaining exposure data creating processing executed by the exposure data creating device 21, i.e., the processor in the computer according to the embodiment. In FIG. 12, the same reference numerals denote the same steps in FIG. 3, and a description thereof will be omitted. Referring to FIG. 12, steps S40 to S49 correspond to step S4 shown in FIG. 3. Steps S102 and S103 may also a part of step S4.

Referring to FIG. 12, in step S1, the region for exposure on the wafer 1 is divided into a plurality of deflection regions. Specifically, layout data as exposure target on the exposure target layer is extracted from design data including the semiconductor device or layout data of the photomask, and the region for exposure is divided into a plurality of deflection regions (sub-fields 12 according to the embodiment) determined depending on the deflection width of the exposure device 23.

In step S101, the pattern is divided into the pattern with the size of electron beams for irradiating the pattern in the deflection region. The shape of the divided pattern is rectangular according to the embodiment. However, the shape of the divided pattern is not limited to be rectangular, a predetermined-shaped pattern is created to the block mask 234, thereby enabling simultaneous irradiation of a plurality of patterns and irradiation of triangular and trapezoidal patterns. In step S101, an area ratio Ar is initialized to 1 with respect to the divided pattern. Incidentally, in the case of /1;2 multiple-exposure in which the amount of exposure is half and the double exposure is performed, the area ratio Ar is set as 0.5. Because it is prevented that the double pattern causes calculation of two times of the area in correcting processing of the amount of exposure, which will be described later. Further, by setting the area ratio Ar to 0.5, conveniently, the amount of exposure is 0.5 times on the calculation. Upon registering the divided patterns into the deflection region, the size of the deflection region is set in advance to be small in consideration of registering again the pattern in the adjacent deflection region later. In step S2, the pattern near the boundary (the boundary of the sub-field 12) of a plurality of deflection regions obtained by dividing the region for exposure in step S1 is extracted. Steps S101 and S2 are repeated by the number of times corresponding to the number of the deflection regions.

In step S3, the pattern adjacent to the pattern extracted in step S2 in different deflection regions (sub-fields 12) is searched within the search region. In steps S40 to S49, the exposure data corresponding to the width of the pattern extracted in step S2 is processed so as to minimize the change in distance between the pattern extracted in step S2 and the pattern searched in step S3 as a result of the positional deviation of the deflection region (sub-field 12). Steps S3 and S40 to S49 are repeated by the number of times corresponding to the number of the extracted patterns.

In step S40, it is determined whether or not the width Pw1 of the extracted pattern P1 is not-less-than the externally-determined width Ws1. When the determining result is YES, in step S41, the extracted pattern P1 is divided into the edge portion and the inner portion, as shown in FIG. 6. In step S42, it is determined whether or not the distance between the patterns P1 and P2, i.e., the space S, is not-more-than the externally-determined interval Int1. When the determining result is NO, the processing advances to step S102, which will be described later. On the other hand, when the determining result in step S42 is YES, in step S43, the edge portion of the extracted pattern P1 on the side of the adjacent patterns P2 is deleted from the original deflection region F1. As shown in FIG. 6, the registration is changed to register again the deleted edge portion to the deflection region F2 of the adjacent patterns P2 as a partner one, and the processing advances to step S102, which will be described later.

If the determining result in step S40 is NO, in step S44, it is determined whether or not the width Pw1 of the extracted pattern P1 is not-less-than the externally-determined width Ws2. When the determining result is YES, in step S45, the extracted pattern P1 is divided into the edge portion and the inner portion, as shown in FIG. 6. In step S46, it is determined whether or not the distance between the patterns P1 and P2, i.e., the space S is not-more-than the externally-determined interval Int2. When the determining result is NO, the processing advances to step S102, which will be described later. On the other hand, when the determining result in step S46 is YES, in step S47, the area ratio Ar of the edge portion of the adjacent patterns P2 as a partner of the edge portion of the extracted pattern P1 on the side of the adjacent patterns P2 is set as 0.5, as shown in FIG. 7, double registration is performed to the deflection regions F1 and F2 of the patterns P1 and P2, and the processing advances to step S102, which will be described later.

If the determining result in step S44 is NO, in step S48, it is determined whether or not the distance between the patterns P1 and P2, i.e., the space S is not-more-than the externally-determined interval Int3. When the determining result is NO, the processing advances to step S102, which will be described later. On the other hand, when the determining result in step S48 is YES, in step S49, as shown in FIG. 8, the area ratio Ar of the adjacent patterns P2 as a partner of the extracted pattern P1 is set as 0.5, double registration is performed to the deflection regions F1 and F2 of the patterns P1 and P2, and the processing advances to step S102, which will be described later.

As mentioned above, a prescribed range for searching the pattern corresponds to the distance to the maximal values of the externally-determined interval Int1, the interval Int2, and the interval Int3 in the vertical direction of sides of the patterns, as shown in FIG. 4. However, as shown in FIG. 4, even if the distance between adjacent patterns is within a prescribed range at the boundary of the deflection region, the pattern shut-off by another pattern is excluded from the search. In the case of the patterns for simultaneous irradiation in which a plurality of patterns are simultaneously irradiated, the adjacent pattern is searched every pattern for simultaneous irradiation. Even if the extracted pattern is for simultaneous irradiation and one of the patterns for simultaneous irradiation is a processing target, the double registration is performed on the unit basis of the pattern for simultaneous irradiation. The pattern that is not the target of the data processing is not changed and is not subjected to the data processing. The exposure data subjected to the data processing is stored to, e.g., the storage unit in the computer.

In step S102, the amount of exposure is subjected to correcting processing. Specifically, with respect to the patterns P1 and P2 to which the area ratio Ar is set as 0.5, except for multiplying the area thereof by 0.5, the corrected amounts of exposure of the patterns P1 and P2 are calculated, similarly to general correction of the amount of exposure.

In step S103, the ratio of the amount of exposure of the patterns P1 and P2 having the set area ratio Ar as 0.5 is multiplied by 0.5, exposure data for electron beams is created, and the processing ends. The exposure data for electron beams is stored to the storage unit in the computer, and is supplied to the electron-beam control device 22 shown in FIG. 2.

Figure 13:
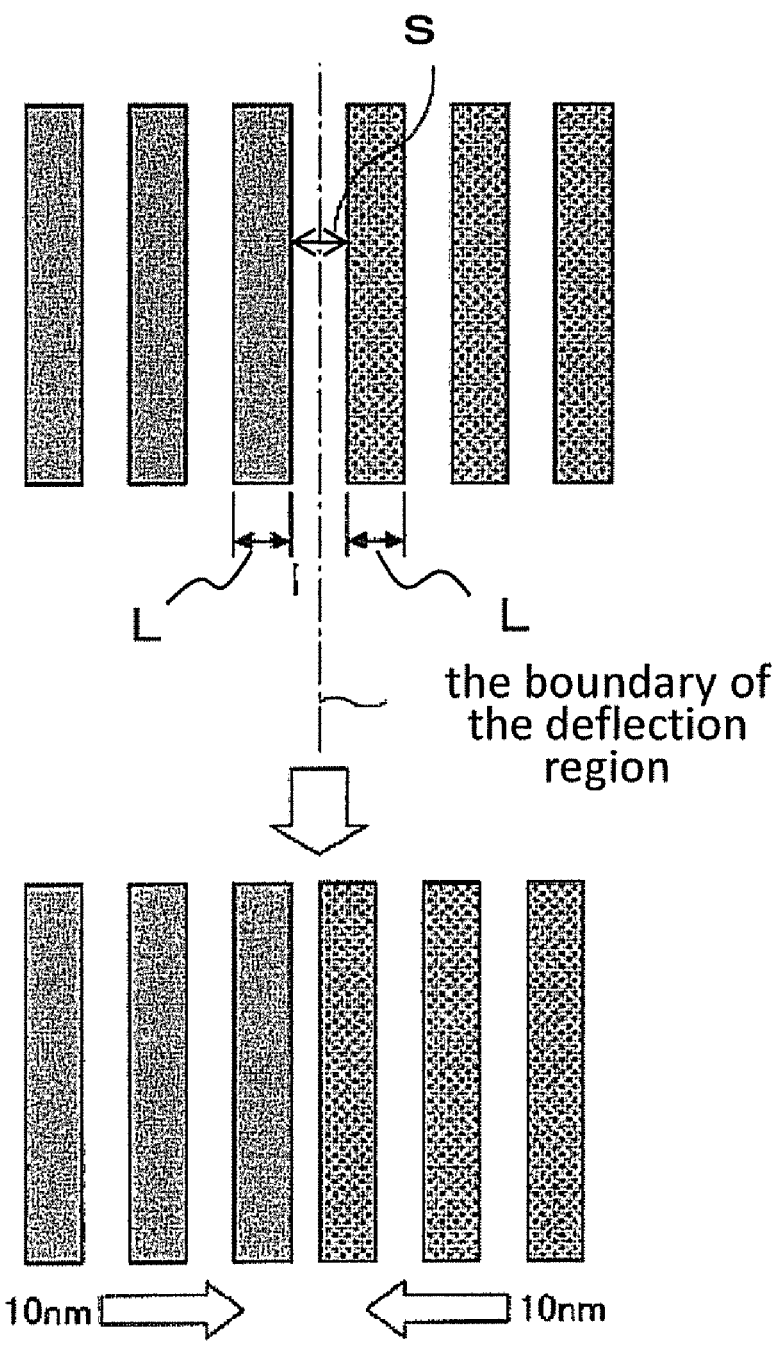
FIG. 13 is an explanatory diagram of an advantage for improving a space resolution when deflection regions on the left and right are moved towards the center in a line-and-space pattern having the deflection regions divided on the left and right at the center.

FIG. 13 is an explanatory diagram of an advantage for improving the space resolution upon moving, toward the center, the deflection regions on the left and right side, in a line-and-space (L/S) pattern having the deflection region divided on the left and right side at the center (i.e., the boundary of the deflection region) according to the embodiment. A line width L of the L/S pattern and a space width S are 500 nm and 150 nm (500L:150S) in the case c1, 210 nm and 120 nm (210L:120S) in the case c2, and 150 nm and 90 nm (150L:90S) in the case c3, respectively. The width of the edge portion is set as 80 nm for the thick L/S pattern in the case c1, and the processing with the data processing method (ma) is performed. The line pattern is divided into two portions (without the inner portion) for the slightly thick L/S pattern in the case c2 and the processing with the data processing method (mb) is performed. The processing with the data processing method (mc) is performed for the thin L/S pattern in the case c3.

Figure 14:
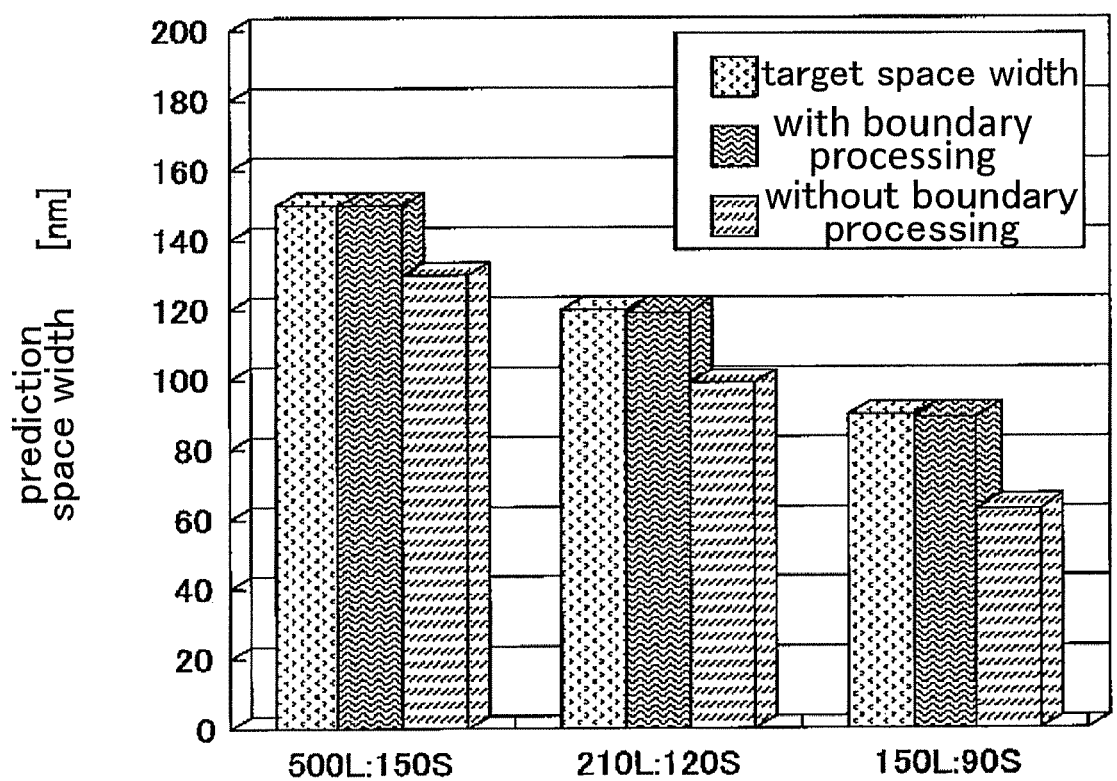
FIG. 14 is a diagram showing a result of exposure simulation.

As shown on the bottom of FIG. 13, a prediction value (prediction space width) of the space width S at the center when the deflection region is position-deviated toward the center by 10 nm is calculated by exposure simulation. FIG. 14 is a diagram showing a result of the exposure simulation. FIG. 14 shows the target space width, the prediction space width when the boundary of the deflection region is subjected to the data processing ("with boundary processing"), and the prediction space width when the boundary of the deflection region is not subjected to the data processing ("without the boundary processing") in the cases c1 to c3. As will be understood from FIG. 14, if the boundary of the deflection region in the L/S pattern in the cases c1 to c3 is not subjected to the data processing, the space is narrower by 20 nm or more. However, by performing the data processing of the boundary of the deflection region in the L/S pattern in cases c1 to c3 according to the embodiment, it is confirmed that an error from the target space width is solved for all L/S patterns.

Figure 15:
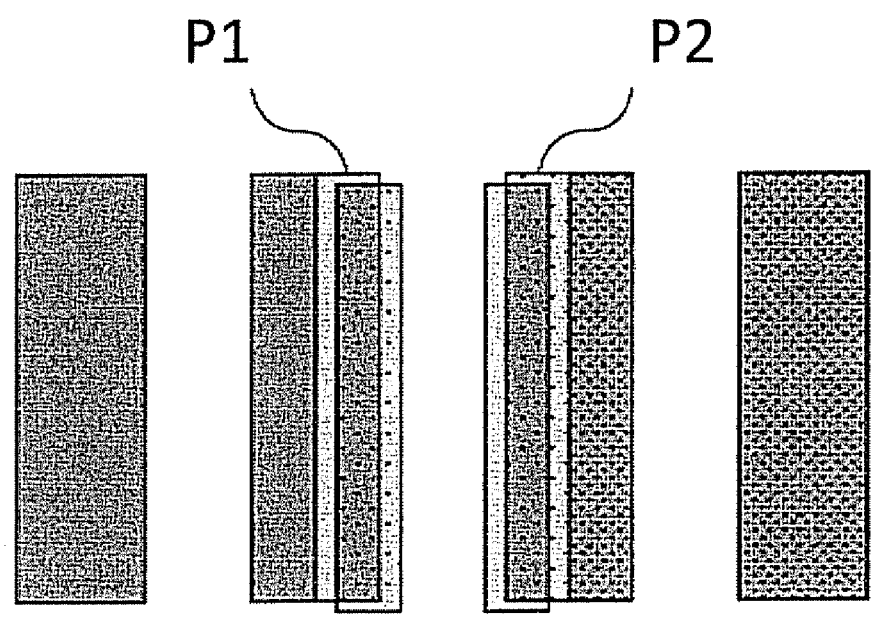
FIG. 15 is an explanatory diagram of exposure processing.
Figure 16A:
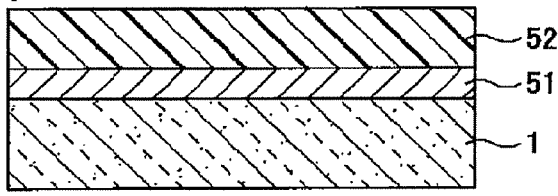
FIGS. 16A to 16F are cross-sectional views for explaining exposure processing and developing processing.

Next, a description will be given of an example of a semiconductor device manufactured by performing the exposure processing on the basis of the exposure data subjected to the data processing and by developing processing with reference to FIGS. 15 to 16F. FIG. 15 is an explanatory diagram of the exposure processing, and FIGS. 16A to 16F are cross-sectional views for explaining the exposure processing and the developing processing. Referring to FIG. 16A, a layer 51 containing a material forming the pattern and a resist layer 52 are laminated on the wafer (semiconductor substrate) 1. The material forming the pattern is not limited. A laminating structure having the semiconductor substrate 1, the layer 51, and the resist layer 52 forms the exposure target.

Figure 16B:
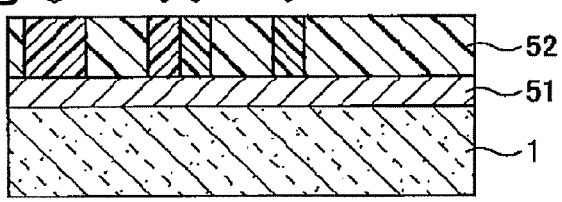
Figure 16C:
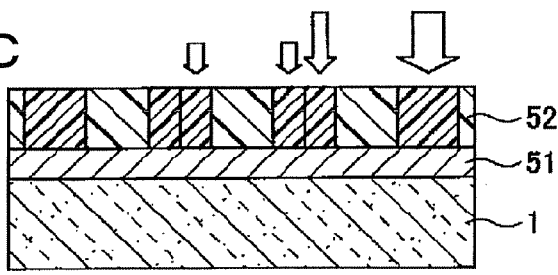

Referring to FIG. 15, in the exposure processing in the manufacturing step of the semiconductor device, the electron-beam exposure device 20 (exposure device 23) draws the pattern P1 in the deflection region F1 to the resist layer 52 on the semiconductor substrate 1 with electron beams as shown in FIG. 16B. Subsequently, the adjacent pattern P2 in the deflection region F2 is also drawn as shown in FIG. 16C.

Figure 16D:
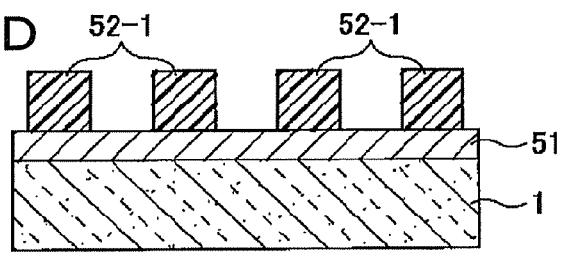
Figure 16E:
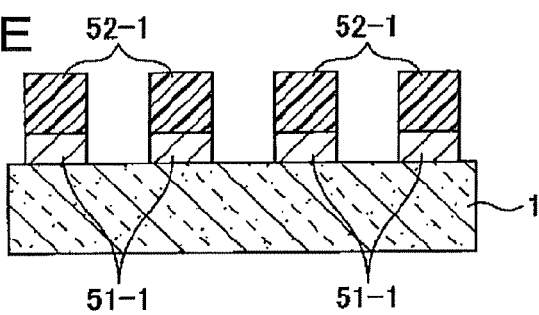
Figure 16F:
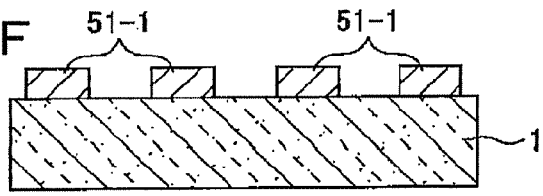

In the developing processing, as shown in FIG. 16D, one portion without exposure in the resist layer 52 remains and the other portion in the resist layer 52 is removed, thereby forming a resist pattern 52-1. Further, as shown in FIG. 16E, the resist pattern 52-1 is used as a mask and etching is performed. Thus, one portion protected by the mask of the layer 51 remains and the other portion of the layer 51 is removed, thereby forming a pattern 51-1. Thereafter, as shown in FIG. 16F, the resist pattern 52-1 is removed, and the desired pattern 51-1 is formed onto the semiconductor substrate 1. The pattern 51-1 is used as the device area partly forming the semiconductor device or wiring.

The process of the exposure data is closed within the adjacent patterns at the boundary of the deflection region. Therefore, the space resolution other than the portion is not influenced from the positional deviation of the deflection region. Further, since only the adjacent pattern is subjected to the data processing of the exposure data at the boundary of the deflection region, the increase in the amount of exposure data due to the data processing of the exposure data is extremely suppressed. Thus, the drawing resolution of the electron-beam exposure device 20 can be improved.

A manufacturing step of a photomask (or reticle) is realized similarly to the manufacturing step of the semiconductor device and a drawing and a description thereof are thus omitted.

Incidentally, the present invention include the following claims.

The present invention is described according to the embodiment. Obviously, the present invention is not limited to the embodiment and can be variously modified within the range of the present invention.

All examples and conditional language recited herein are intended for pedagogical purposes to aid the reader in understanding the invention and the concept contributed by the inventor to furthering the art, and are to be construed as being without limitation to such specifically recited examples and conditions, nor does the organization of such examples in the specification related to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method for manufacturing a semiconductor device or a photomask, the method being executed by an exposure device, the method comprising:
    extracting a first pattern that exists within a range of a first distance to a boundary of first and second deflection regions, the first pattern being in the first deflection region and using exposure data stored by the exposure device;
    searching a second pattern that is adjacent to the first pattern and in the second deflection region different from the first deflection region, using the exposure data that is included; and
    performing first data processing using the exposure data when the pattern width of the first pattern is a first width or more, the first data processing including:
        dividing the first pattern into an edge portion and an inner portion, and
        moving the boundary of the first deflection region to inside of the first pattern by changing registration of the edge portion of the first pattern on the existing side of the adjacent second pattern within the range of the first distance to the second deflection region of the second pattern;
    performing second data processing using the exposure data when the pattern width of the first pattern is less than the first width but greater than or equal to a second width, the second data processing including:
        dividing the first pattern into the edge portion and the inner portion,
        performing double-registration for the edge portion of the first pattern, to the first and second deflection regions, the edge portion being on the existing side of the adjacent second pattern within a second distance, so that double-exposing is performed about the edge portion, and
        setting the amounts of exposure of the edge portion of the first pattern in the first and second deflection regions to half;
    performing third data processing using the exposure data when the pattern width of the first pattern is less than the second width, the third data processing including:
        performing double-registration for the first pattern and the adjacent second pattern, to the first and second deflection regions, the adjacent second pattern being within the second distance, so that double-exposing is performed about the first pattern and the adjacent second pattern, and
        setting the amounts of exposure of the first pattern and the adjacent second pattern in the first and second deflection regions to half; and
    exposing a pattern on the semiconductor device or a photomask by using exposure data that is obtained by the first data processing, the second data processing or the third data processing while scanning the first and second deflection regions, determined depending on a deflection width of an exposure device on an exposure target with electron beams emitted from the exposure device.

2. The method for manufacturing a semiconductor device or a photomask according to claim 1, wherein the searching the second pattern and the performing the first, second or third data processing of the exposure data are repeated by the number of times corresponding to the number of extracted first patterns.

3. The method for manufacturing a semiconductor device or a photomask according to claim 1, wherein, when the range of an allowable amount of change to a line width is ±Tp % and the maximal amount of the positional deviation of the deflection region is ΔXmax, the first width is not less than (2×ΔXmax)/(Tp/100).

4. The method for manufacturing a semiconductor device or a photomask according to claim 1, wherein, when the range of the allowable amount of change to a line width is ±Tp % and the maximal amount of the positional deviation of the deflection region is ΔXmax, the second width is not less than ΔXmax/(Tp/100).

5. The method for manufacturing a semiconductor device or a photomask according to claim 1, wherein when two or more types of data processing are selected among the first data processing, the second data processing and the third data processing in accordance with a condition of the first and second adjacent patterns at the boundary of the first and second deflection regions, one of the data processing selected in accordance with a largest pattern width among the first and second adjacent patterns is performed.

6. The method for manufacturing a semiconductor device or a photomask according to claim 1, wherein, even if the distance between the first and second adjacent patterns at the boundary of the deflection region is within a prescribed range and is shut-off by another pattern, the performing data processing of the exposure data does not perform data processing of a combination of the first and second patterns, the data processing being the first data processing, the second data processing or the third data processing.

7. The method for manufacturing a semiconductor device or a photomask according to any one of claims 1, 2, 3, 4, 5 or 6, wherein the performing the first, second or third data processing of the exposure data performs the data processing of only the pattern within the range of the first distance to the boundary of the first and second deflection regions perpendicular to a scanning direction of the one of the first and second deflection regions with the exposure device.

8. The method for manufacturing a semiconductor device or a photomask according to claim 1, the method further comprising:
setting an area ratio of the first pattern and the adjacent second pattern double-registered as 0.5;
correcting the amounts of exposure of the first pattern and the adjacent second pattern by multiplying, by 0.5, the area of the first pattern and the adjacent second pattern to which the area ratio is set as 0.5, and calculating correcting amounts of exposure of the first and second patterns; and
creating exposure data for electron beams by multiplying, by 0.5, a ratio of the amounts of exposure of the first pattern and the adjacent second pattern to which the area ratio is set as 0.5 and by replacing the ratio to the multiplied one, and then supplying the created data to the exposure device.

9. The method for manufacturing a semiconductor device or a photomask according to claim 8, the method comprising:
dividing the patterns in the first and second deflection regions into patterns with the size of electron beams for irradiation before the extracting step and initializing the area ratio to 1.0.

10. The method for manufacturing a semiconductor device or a photomask according to claim 1, the method comprising:
dividing a region for exposure on the exposure target into a plurality of fields determined depending on the deflection width of a main deflector in the exposure device and further dividing the fields into a plurality of sub-fields determined depending on the deflection width of a sub-deflector in the exposure device so that the deflection region comprises one sub-field or one field,
wherein electron beams for variable shaping are irradiated onto the exposure target so as to expose the pattern every sub-field when the deflection region comprises one sub-field or every field when the deflection region comprises one field.

11. A computer-readable storage medium for storing the program for executing a method for manufacturing a semiconductor device or a photomask, the method comprising:
extracting a first pattern near the boundary of a first deflection region and in the first deflection region;
searching a second pattern adjacent to the first pattern and in a second deflection region different from the first deflection region; and
performing first data processing when the pattern width of the first pattern is a first width or more, the first data processing including:
dividing the first pattern into an edge portion and an inner portion, and
moving the boundary of the deflection region to inside of the first pattern by changing registration of an edge portion of the first pattern on the existing side of the adjacent second pattern within the range of a first distance to the second deflection region of the second pattern;
performing second data processing when the pattern width of the first pattern is less than the first width but greater than or equal to a second width, the second data processing including:
dividing the first pattern into the edge portion and an inner portion,
performing double-registration for the edge portion of the first pattern, to the first and second deflection regions, the edge portion being on the existing side of the adjacent second pattern within a second distance, so that double-exposing is performed about the edge portion, and
setting the amounts of exposure of the edge portion of the first pattern in first and second deflection regions to half;
performing third data processing when the pattern width of the first pattern is less than the second width, the third data processing including:
performing double-registration for the first pattern and the adjacent second pattern, to the first and second deflection regions, the adjacent second pattern being within the second distance, so that double-exposing is performed about the first pattern and the adjacent second pattern, and
setting the amounts of exposure of the first pattern and the adjacent second pattern in the first and second deflection regions to half; and
exposing a pattern on the semiconductor device or a photomask by using exposure data that is obtained by the first data processing, the second data processing or the third data processing while scanning the first and second deflection regions, determined depending on a deflection width of the exposure device on an exposure target with electron beams emitted from the exposure device.

12. A computer-readable storage medium for storing the program according to claim 11, wherein the searching the second pattern and the performing the first second or third data processing of the exposure data are repeated by the number of times corresponding to the number of extracted first patterns.

13. A computer-readable storage medium for storing the program according to claim 11, wherein, when the range of an allowable amount of change to a line width is ±Tp % and the maximal amount of the positional deviation of the deflection region is $\Delta Xmax$, the first width is not less than $(2 \times \Delta Xmax)/(Tp/100)$.

14. A computer-readable storage medium for storing the program according to claim 11, wherein, when the range of the allowable amount of change to a line width is ±Tp % and the maximal amount of the positional deviation of the deflection region is $\Delta Xmax$, the second width is not less than $\Delta Xmax/(Tp/100)$.

15. A computer-readable storage medium for storing the program according to claim 11, the method further comprising:
setting an area ratio of the first pattern and the adjacent second pattern double-registered as 0.5;
correcting the amounts of exposure of the first pattern and the adjacent second pattern by multiplying, by 0.5, the area of the first pattern and the adjacent second pattern to which the area ratio is set as 0.5, and calculating correcting amounts of exposure of the first pattern and adjacent second pattern; and
creating exposure data for electron beams by multiplying, by 0.5, a ratio of the amounts of exposure of the first pattern and the adjacent second pattern to which the area ratio is set as 0.5 and by replacing the ratio to the multiplied one, and then supplying the created data to the exposure device.

16. A computer-readable storage medium for storing the program according to claim 15, the method further comprising:
   dividing the patterns in the first and second deflection regions into patterns with the size of electron beams for irradiation before the extracting step and initializing the area ratio to 1.0.

17. A computer-readable storage medium for storing the program according to claim 11, the method further comprising:
   dividing a region for exposure on the exposure target into a plurality of fields determined depending on the deflection width of a main deflector in the exposure device and further dividing the fields into a plurality of sub-fields determined depending on the deflection width of a sub-deflector in the exposure device so that the deflection region comprises one sub-field or one field,
   wherein electron beams for variable shaping are irradiated onto the exposure target so as to expose the pattern every sub-field when the deflection region comprises one sub-field or every field when the deflection region comprises one field.

* * * * *

UNITED STATES PATENT AND TRADEMARK OFFICE
CERTIFICATE OF CORRECTION

| | |
|---|---|
| PATENT NO. | : 8,022,376 B2 |
| APPLICATION NO. | : 12/364077 |
| DATED | : September 20, 2011 |
| INVENTOR(S) | : Kozo Ogino et al. |

Page 1 of 1

It is certified that error appears in the above-identified patent and that said Letters Patent is hereby corrected as shown below:

Column 14, Line 33, In Claim 12, delete "first" and insert --first,--, therefor.

Signed and Sealed this
Twenty-second Day of November, 2011

David J. Kappos
*Director of the United States Patent and Trademark Office*